United States Patent [19]
Piechocki

[11] 3,804,319
[45] Apr. 16, 1974

[54] COMPENSATOR BASE FOR LEAD-FRAME BONDING

[75] Inventor: Benjamin Piechocki, Bethlehem, Pa.

[73] Assignee: Western Electric Company Incorporated, New York, N.Y.

[22] Filed: Feb. 16, 1973

[21] Appl. No.: 333,267

Related U.S. Application Data

[62] Division of Ser. No. 207,854, Dec. 14, 1971, Pat. No. 3,729,810.

[52] U.S. Cl. ...................... 228/6, 156/580, 269/310
[51] Int. Cl. ........................................ B23k 19/00
[58] Field of Search ............. 228/4, 6, 44; 269/310, 269/311; 156/580

[56] References Cited
UNITED STATES PATENTS

| | | | |
|---|---|---|---|
| 2,561,196 | 7/1951 | Gauthier | 269/310 X |
| 3,541,673 | 11/1970 | Cushman | 269/310 X |
| 3,608,809 | 9/1971 | Cushman | 228/4 X |
| 3,669,333 | 6/1972 | Coucoulas | 228/4 X |
| 3,669,806 | 6/1972 | Cushman | 156/580 |

*Primary Examiner*—J. Spencer Overholser
*Assistant Examiner*—Robert J. Craig
*Attorney, Agent, or Firm*—R. Y. Peters; P. J. Tribulski, Jr.; A. Stapler

[57] ABSTRACT

Bonding of lead frames to ceramic substrates is performed on a bonder with a compensating base. The compensating base includes a series of cantilever spring elements attached to a rigid support. The elements are reduced in cross-sectional area near the point of attachment to the rigid support. A free end of each of the spring elements is placed under each point of the substrate to which a lead is to be bonded. The elements accomodate to variations in thickness and waviness of the substrate so that it does not crack during the bonding operation.

5 Claims, 3 Drawing Figures

PATENTED APR 16 1974 3,804,319

SHEET 2 OF 2

COMPENSATOR BASE FOR LEAD-FRAME BONDING

This is a division, of application Ser. No. 207,854 filed Dec. 14, 1971 now Pat. No. 3,729,810.

BACKGROUND OF THE INVENTION

1. Field of the Invention

This invention relates to thermocompression bonding of lead frames to brittle substrates such as thin-film circuits formed on ceramic substrates.

2. Description of the Prior Art

In the bonding of lead frames to thin-film circuits, it has long been recognized that a system of compensation is necessary. (See, for example, U.S. Pat. No. 3,608,809 issued to R. H. Cushman on Sept. 28, 1971.) Ceramic materials used as substrates for thin-film circuits are notoriously wavy and non-uniform in thickness. Thermocompression bonding of lead frames to the circuits on such ceramic substrates produces highly localized forces and stresses. The result of these stresses on the non-uniformly shaped substrates is a certain degree of irreparable cracking of the substrates with a consequent loss of entire thin-film circuits.

The difficulties of providing compensation are compounded by the fact that the thin-film circuits have very closely spaced leads. It is desirable to independently support each lead position during bonding. Such independent support is very difficult to achieve because the space available for spring elements or the like is extremely limited.

Various systems have been proposed and used for providing the desired compensation during bonding. While a number of the systems have appeared to be successful, no one of the systems has been totally successful in eliminating cracking of ceramic substrates during bonding.

At low volume production, a certain amount of cracking is economically tolerable. However, when production volume reaches high levels, a small percentage of breakage results in large absolute numbers of discarded thin-film circuits. The cost of such damage becomes significant and highly undesirable.

In addition to providing compensating arrangements to prevent cracking of substrates, attempts have been made to perform bonding operations at a slow speed. Also bonding has been performed by operating on only one lead at a time. These slow bonding processes, however, have the obvious disadvantage that high volume production can only be achieved by employing a great number of machines and a great number of employees to operate the machines. Clearly, such schemes for preventing cracking are economically unattractive.

SUMMARY OF THE INVENTION

It is therefore an object of this invention to provide an improved compensating system for a thermocompression bonder which will substantially reduce the frequency of cracking of brittle substrates.

It is a further object of the invention to provide a compensating system for a bonder which will permit crack-free operation at high bonding speeds.

It is a still further object of the invention to provide a compensating system which will operate effectively in circumstances where closely-spaced leads are being bonded.

These and other objectives are achieved by providing a bonder with a compensating base that includes a plurality of cantilever spring elements extending from a rigid support and corresponding in location to desired bonding points. The springs deflect to provide for stress relief during bonding.

BRIEF DESCRIPTION OF THE DRAWINGS

Other objects and features of the present invention will be more readily understood from the following detailed description of specific embodiments thereof, when read in conjunction with the appended drawings in which.

DETAILED DESCRIPTION

Figure 1:
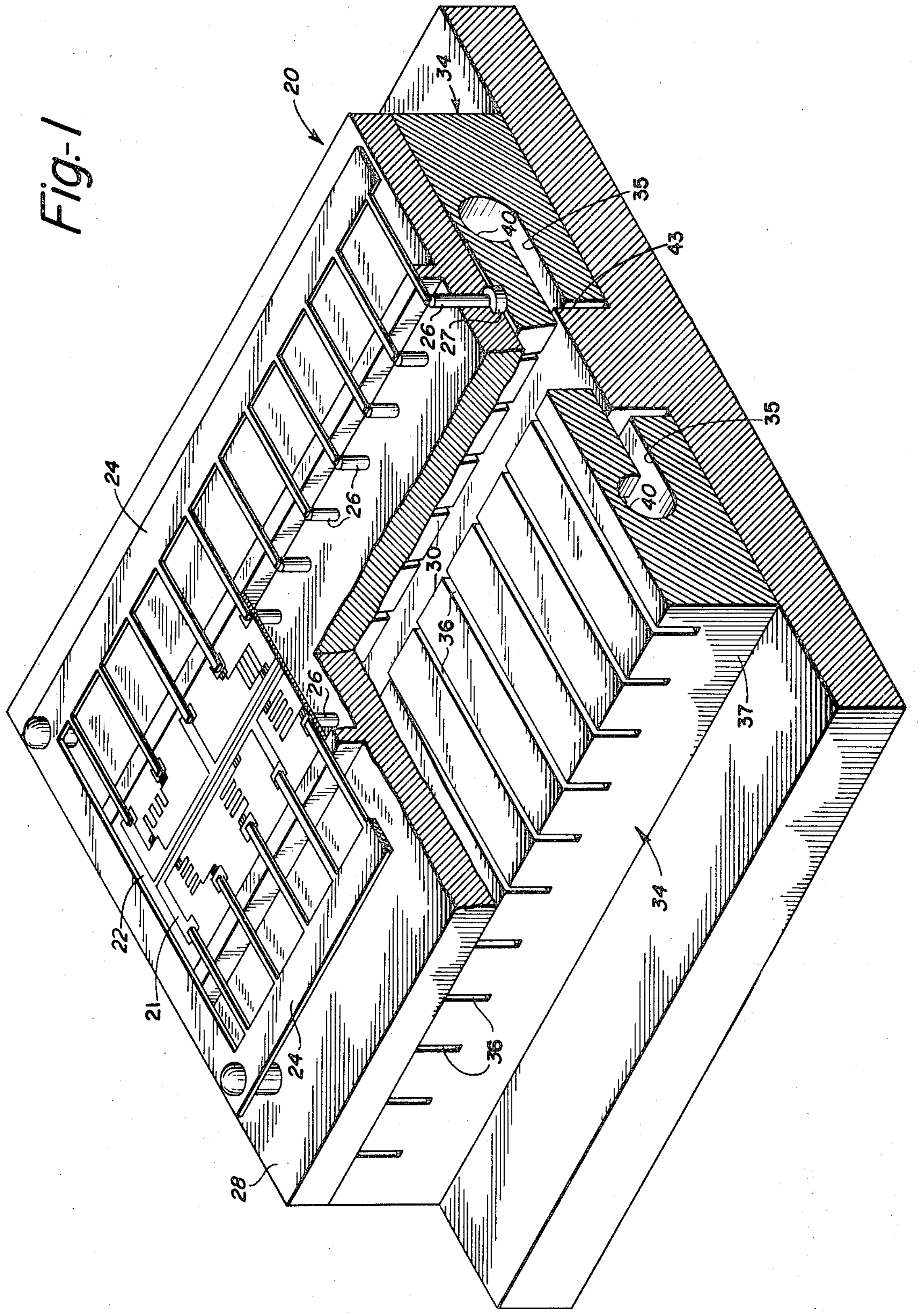
FIG. 1 is a perspective view of an inventive compensating base for a bonding apparatus with various portions of the base and workpieces removed for purposes of clarity.
Figure 2:
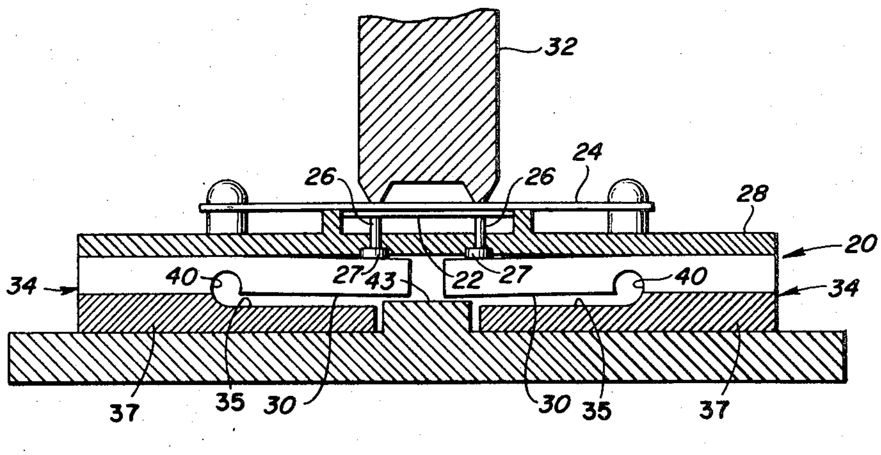
FIG. 2 is an end view of the inventive compensating base of FIG. 1 showing a bonding head engaged with a workpiece.

Referring now to FIGS. 1 and 2, a compensating base, designated generally by the numeral 20, is shown with a thin-film circuit 21 formed on a substrate 22 positioned for bonding. A lead frame 24 overlies the substrate 22. The base 20 is provided with a plurality of movable pins 26 projecting through a platform member 28. The pins 26 are positioned so that one pin underlies each lead of the lead frame 24.

Figure 3:
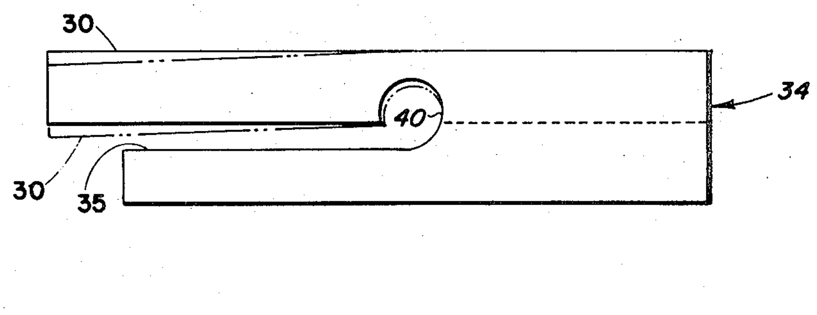
FIG. 3 is an end view of a spring element of the base of FIG. 1 with an exaggerated illustration of the mode of deflection of the spring element.

The pins 26 are free to move vertically within holes formed in the platform 28. The bottom end of each of the pins 26 is provided with a head 27 which rests on a compensating spring element 30. As shown in FIGS. 2 and 3, when a bonding head or thermode 32 is pressed against the substrate 22 and the leads of the lead frame 24, the pins 26 are pushed downwardly against the spring elements 30. Each one of the pins 26 is free to move independently so that the proper vertical position is provided for a particular portion of the ceramic substrate 22. Since the substrates 22 are not necessarily planar or uniform in thickness, each of the individual pins 26 may assume a vertical position which is different from that of the other pins.

A plurality of the spring elements 30 are illustratively shown as being integral with one of a pair of single-piece compensating units 34. It can be seen that each of the units 34 have been produced by machining a slot 35 along a horizontal axis of the unit. The slot 35, of course, does not extend through the entire depth of the unit 34. The spring elements 30 are separated from one another by machining a series of parallel separating slots 36 along the length of each of the units 34.

At the closed end of the slot 35 a hole 40 has been drilled along the entire length of the unit 34. The resultant structure of the unit 34 is one in which the spring elements 30 can move independently of one another in a cantilever fashion but are attached to a rigid base 37. In one advantageous arrangement shown in the drawings, the point of attachment of the spring elements 30 to the rigid portions of the unit 34 has a reduced cross-sectional area due to the presence of the hole 40. Virtually all of the deflection of the spring elements 30 takes place in these reduced cross-section regions. The portions of the spring elements 30 having the larger cross-sectional areas are substantially rigid. This configuration and resultant deflection pattern is shown in FIG. 3. The result of this type of shaping and deflection system is that the force needed to deflect the free ends of the spring elements 30 is linearly related to the amount of deflection which occurs. In other words, a constant force-to-deflection ratio exists. The configuration of the spring elements 30 permits rapid bonding to take place without cracking of the circuits 22.

As shown in FIG. 2, each of the pins 26 is provided with a head 27. When the units 34 are assembled with the platform member 28, the spring elements 30 are deflected from their relaxed position by a distance equivalent to the projecting height of the heads 27. The pins 26 and their heads 27 are ground after assembly to provide an accurately determined displacement. This displacement places the spring elements 30 in a pre-stressed state. The pre-stressed state is a desirable one, because the neutral or return position of the free ends of the pins 26 is always positively determined.

A stop member 43 is provided to limit the vertical travel of the free ends of the spring elements 30. The member 43 has a thickness such that the distance between the lower side of the spring elements 30 and the upperside of the member 43 is limited. The distance is limited to the extent that when the spring elements 30 are driven into contact with the stop member 43, the attachment regions of the spring elements to the unit 34 are still in a state of elastic deformation. In other words, the compensating unit 34 and stop member 43 are constructed so that the spring elements 30 cannot be over-stressed to the point of plastic deformation.

While the compensating units 34 have been described as being integral structures, it should be clear that compensating units can be easily constructed as a stacked arrangement (not shown) of members that have the general configuration of one end of the unit 34. Spacers can be placed between the stacked members to provide separation between the spring elements.

The structure of the compensatng base 20 is particularly advantageous where a great many leads are attached to a substrate with a close lead-to-lead spacing. It has been found entirely practical to bond leads onto substrates with a center-to-center spacing of the leads of only 0.075 inch. The spring elements 30 are made 0.055 inch thick and are spaced from each other by a distance of 0.020 inch.

By way of example, it has been determined that a spring element have a moment arm of 0.300 inch and a cross-sectional dimension of 0.055 inch × 0.125 inch performs quite satisfactorily in high speed bonding of ceramic substrates formed of alumina having a thickness of 0.027 inch. The cross-sectional area of the spring element is reduced to 0.055 inch × 0.080 inch at the point of connection with the rigid base member. A very desirable material for the spring element is Alloy 25-CA172, H Temper Beryllium Copper available from Brush Beryllium Co. of Cleveland Ohio.

Although certain embodiments of the invention have been shown in the drawings and described in the specification, it is to be understood that the invention is not limited thereto, is capable of modification and can be arranged without departing from the spirit and scope of the invention.

What is claimed is:

1. Apparatus for bonding a plurality of leads to a substantially planar substrate, which comprises:

compensating means including a plurality of spring elements, each having a cantilever structure with a free end underlying each point of the substrate to which a lead is to be bonded and each spring element having an end opposite the free ends to form a common base integral with and spaced from the free ends so that the free ends and the base form a structure with a U-shaped cross section, each free end being individually movable to prevent cracking of the substrate during bonding.

2. Bonding apparatus, which comprises:

a spring member having a rigid base; and a plurality of compensating elements, each having one end attached to and integral with the base and extending therefrom to form an opposite free end spaced from the base so that the base and the free end form a structure with a U-shaped cross section, each element also having a substantially uniform cross-sectional area except at the point of attachment to the base at which point the cross-sectional area of each element is reduced, whereby the free ends of the elements are provided with a constant force-to-deflection ratio.

3. The apparatus of claim 2, wherein the member is formed of a single block of metal and the U-shaped cross section has two legs, one of which forms the rigid base, wherein the other leg is cut to form the individual compensating elements.

4. The apparatus of claim 2, wherein the compensating elements are parallel to each other.

5. The apparatus of claim 4, wherein the center-to-center distance of the compensating elements is less than 0.100 inch.

* * * * *